(12) United States Patent
Asawa et al.

(10) Patent No.: US 7,564,381 B1
(45) Date of Patent: Jul. 21, 2009

(54) SYSTEM AND METHOD FOR CODE-BASED COMPRESSION IN A COMMUNICATIONS ENVIRONMENT

(75) Inventors: Manjari Asawa, Cupertino, CA (US); Mehryar K. Garakani, Westlake Village, CA (US); Tmima Koren, Cupertino, CA (US); Rong Wang, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 1300 days.

(21) Appl. No.: 10/779,166

(22) Filed: Feb. 16, 2004

(51) Int. Cl.
*H03M 7/00* (2006.01)

(52) U.S. Cl. .................. 341/106; 341/107; 341/173; 341/174; 341/175; 370/232; 370/233; 370/235; 370/236

(58) Field of Classification Search ............ 341/106, 341/173, 174, 175, 107; 370/232–236
See application file for complete search history.

(56) References Cited

U.S. PATENT DOCUMENTS

| | | | | |
|---|---|---|---|---|
| 5,293,379 A | * | 3/1994 | Carr | 370/474 |
| 5,396,228 A | * | 3/1995 | Garahi | 340/7.53 |
| 5,430,715 A | * | 7/1995 | Corbalis et al. | 370/392 |
| 5,663,721 A | * | 9/1997 | Rossi | 341/51 |
| 5,894,557 A | | 4/1999 | Bade et al. | 395/200.58 |
| 6,134,245 A | | 10/2000 | Scarmalis | 370/474 |
| 6,192,051 B1 | | 2/2001 | Lipman et al. | 370/389 |
| 6,363,065 B1 | | 3/2002 | Thornton et al. | 370/352 |
| 6,400,722 B1 | | 6/2002 | Chuah et al. | 370/401 |
| 6,477,595 B1 | | 11/2002 | Cohen et al. | 710/105 |
| 6,512,754 B2 | | 1/2003 | Feder et al. | 370/338 |
| 6,512,773 B1 | | 1/2003 | Scott | 370/395.61 |
| 6,597,660 B1 | * | 7/2003 | Rueda et al. | 370/230.1 |
| 6,999,461 B2 | * | 2/2006 | Li et al. | 370/400 |
| 7,019,674 B2 | * | 3/2006 | Cadambi et al. | 341/106 |
| 7,248,585 B2 | * | 7/2007 | Kohn et al. | 370/392 |
| 2001/0036188 A1 | * | 11/2001 | Carlsson | 370/395 |
| 2004/0066799 A1 | * | 4/2004 | Li et al. | 370/474 |
| 2004/0246966 A1 | * | 12/2004 | Wu et al. | 370/395.1 |
| 2005/0146451 A1 | * | 7/2005 | Kobayashi et al. | 341/107 |

* cited by examiner

*Primary Examiner*—Linh V Nguyen
(74) *Attorney, Agent, or Firm*—Baker Botts L.L.P.

(57) ABSTRACT

A method for compressing information is provided that includes receiving a plurality of bits associated with a communications flow and determining if a match exists between the plurality of bits and a selected one of a plurality of bit patterns. A header bit segment that corresponds to the selected bit pattern may be communicated in place of the plurality of bits associated with the communications flow.

29 Claims, 3 Drawing Sheets

SYSTEM AND METHOD FOR CODE-BASED COMPRESSION IN A COMMUNICATIONS ENVIRONMENT

TECHNICAL FIELD OF THE INVENTION

The present invention relates in general to the field of communications and, more particularly, to a system and a method for code-based compression in a communications environment.

BACKGROUND OF THE INVENTION

Communication systems and architectures have become increasingly important in today's society. One aspect of communications relates to maximizing bandwidth and minimizing delays associated with data and information exchanges. Compression operations may be used by network operators to produce high percentages of bandwidth saving for any given transport that is being implemented. In certain scenarios, network operators may consider compressing common communication patterns that appear on a given communication link.

Many architectures for effectuating proper data exchanges add significant overhead and cost in order to accommodate a large number of end users or data streams. For example, a large number of T1/E1 lines may be implemented to accommodate heavy traffic, but such lines are generally expensive and, thus, usage of each one should be maximized (to the extent that it is possible) in order to achieve optimal system performance. Accordingly, the ability to provide a communications system that consumes few resources, optimizes bandwidth, and achieves minimal delay presents a significant challenge for network designers, service providers, and system administrators.

SUMMARY OF THE INVENTION

From the foregoing, it may be appreciated by those skilled in the art that a need has arisen for an improved compression/multiplexing approach that optimizes data exchanges in a communications environment. In accordance with one embodiment of the present invention, a system and a method for providing code-based compressing/multiplexing operations in a communications environment are provided that substantially eliminate or greatly reduce disadvantages and problems associated with conventional compression techniques.

According to one embodiment of the present invention, there is provided a method for compressing information in a communications environment that includes receiving a plurality of bits associated with a communications flow and determining if a match exists between the plurality of bits and a selected one of a plurality of bit patterns. If the match exists, a header bit segment that corresponds to the selected bit pattern may be communicated in place of the plurality of bits associated with the communications flow.

Certain embodiments of the present invention may provide a number of technical advantages. For example, according to one embodiment of the present invention, a communications approach is provided that is lossless and that enhances bandwidth parameters for a given architecture. This is a result of the communications scheme, which provides bandwidth gains via pattern matching operations. A given input bit stream may be matched to a bit pattern, which can be used to represent (and thereby minimize communication of) the stream. This may be beneficial to service providers, as effective compression protocols reduce their operating expenditures.

This enhancement to compression/multiplexing protocols is flexible in that it can be provided for any communication stream. This is because the solution does not require a state machine per call, nor is it burdened with complex tracking or monitoring operations involved in many compression processes. In this sense, minimal overhead is incurred as a result of the operations of the present invention. This further allows such a configuration to accommodate a wide range of incoming flows, as it may be extended to any type of traffic arrangements.

Certain embodiments of the present invention may enjoy some, all, or none of these advantages. Other technical advantages may be readily apparent to one skilled in the art from the following figures, description, and claims.

BRIEF DESCRIPTION OF THE DRAWINGS

For a more complete understanding of the present invention and the advantages thereof, reference is made to the following description taken in conjunction with the accompanying drawings, wherein like reference numerals represent like parts, in which.

DETAILED DESCRIPTION OF THE INVENTION

Figure 1:
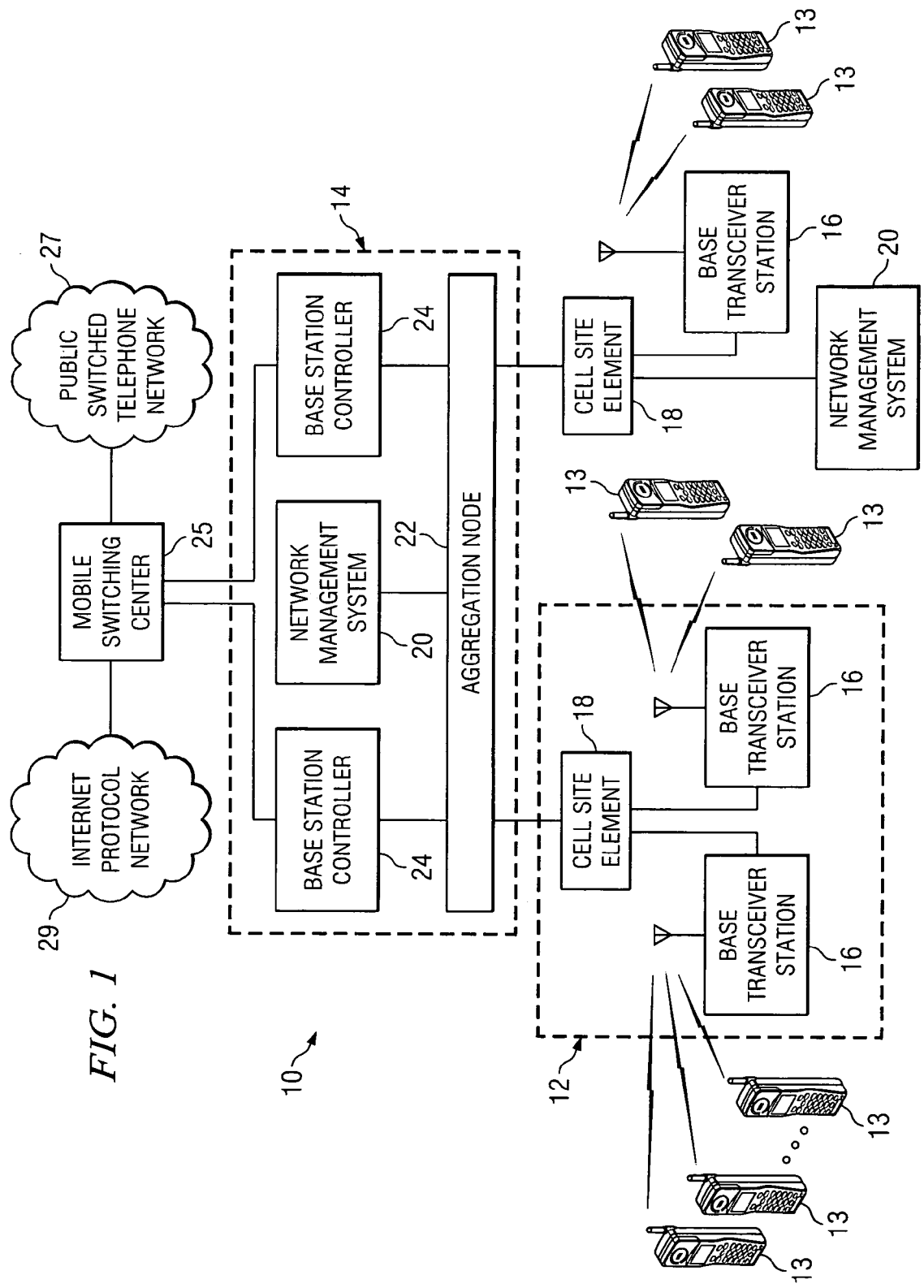
FIG. 1 is a simplified block diagram of a communication system for compressing and multiplexing data.

FIG. 1 is a simplified block diagram of a communication system 10 for the code-based compression of data in a communications environment. Communication system 10 may include a plurality of cell sites 12, a plurality of mobile stations 13, a central office site 14, a plurality of base transceiver stations 16, a plurality of cell site elements 18, and a network management system 20. Additionally, communication system 10 may include an aggregation node 22, a plurality of base station controllers 24, a mobile switching center 25, a public switched telephone network (PSTN) 27, and an Internet protocol (IP) network 29.

Communication system 10 may generally be configured or arranged to represent a 2.5G architecture applicable to a Global System for Mobile (GSM) environment in accordance with a particular embodiment of the present invention. However, the 2.5G architecture is offered for purposes of example only and may alternatively be substituted with any suitable networking system or arrangement that provides a communicative platform for communication system 10. For example, the present invention may be used in conjunction with data communications, such as those that relate to packet data transmissions. Additionally, communication system 10 may be provided in a 3G network, where 3G equivalent networking equipment is provided in the architecture. Communication system 10 is versatile in that it may be used in a host of communications environments such as in conjunction with any time division multiple access (TDMA) element or protocol for example, whereby signals from end users, subscriber units, or mobile stations 13 may be multiplexed over the time domain.

In accordance with the teachings of the present invention, a codebook approach to compression is offered on a per-call or per-flow basis. An incoming bit pattern may be evaluated to determine its corresponding code match. A header may then be used to indicate that the incoming stream reflects a predefined pattern, which may have previously been identified as common: in the context of establishing the patterns to be potentially identified by the architecture. The input stream may be subsequently removed, whereby only the header bits are sent to represent the input stream. Such header codes may reflect common communications streams that are found propagating in the network most often. This recognition and matching (of more prevalent streams) would allow the greatest savings to compression operations. In cases where no match exists for the incoming pattern, a header may be provided that reflects this condition. In such a case, the entire stream could then be sent, as the architecture would be unable to represent a diverse bit pattern with fewer bits than currently provided to represent the incoming stream. A demultiplexer positioned downstream may then simply perform a series of reverse operations.

Using such a protocol, communication system 10 provides a simplistic solution for reducing compression and decompression operations. In addition to creating minimal overhead and being easy to implement (with potential modifications only being made to aggregation node 22 and cell site element 18), such an approach could cooperate with any suitable compression protocol or arrangement. Moreover, such an approach does not require a state machine per call and can be readily extended to a variety of codec arrangements.

Communication system 10 capitalizes on the premise that, in a normal traffic call, more than 50% of the time a user is silent (i.e. not talking). The silence frame structure is defined in certain GSM specifications, where all the codec bits are simply filled with ones. The slots not carrying traffic (i.e. not assigned to a call) are generally required to carry a predefined pattern (e.g. 0101 . . . for sixteen kilobits/s multiplexing). Communication system 10 is able to compress the common well-defined patterns using a simple and relatively small (e.g. two bit) code that may be transmitted over the long haul links. The original pattern may then be regenerated at the other (receiving) end before being delivered to an appropriate next destination.

The functional flow of communication system 10 may follow a bits in/bits out protocol, being dependent only on the received bit pattern. Input DS0s may be demultiplexed to create an appropriate number of sub-rate DS0s, each corresponding to a different call. For each sub-rate DS0, a certain portion (e.g. two milliseconds) of samples may be collected synchronously. Because the corresponding inputs are time-division multiplexed (TDM) streams, the collection operation should be completed at roughly the same time. For sixteen kilobits/sec multiplexing, this results in a collection of four bytes of data from each stream at about the same time.

The collected samples may be compared to a few pre-identified patterns (e.g. the most commonly occurring input streams) and decisions may be made regarding which bits are to be compressed with corresponding header bits representing the match result. A header of, for example, two bits may be provided and reflect the bit pattern being sent. The receiving end may then perform reverse operations in undoing the matching in order to restore the bit stream and communicate it to its intended next destination.

Such a mechanism may be easy to implement and it is lossless. Thus, information that is received at one point is sent downstream in a manner that will preserve its integrity. Communication system 10 provides an architecture in which data that is received at one end is renewed at the other. This mechanism is simplistic, in that it does not involve the monitoring or maintenance of state conditions (e.g. which subframe was involved, the state of the transmission, the state of receiver, etc.).

Mobile station 13 may be used to initiate a communication session that may benefit from such a compression protocol. Mobile station 13 may be an entity, such as a client, subscriber, end user, or customer that seeks to initiate a data flow or exchange in communication system 10 via any suitable network. Mobile station 13 may operate to use any suitable device for communications in communication system 10. Mobile station 13 may further represent a communications interface for an end user of communication system 10. Mobile station 13 may be a cellular or other wireless telephone, an electronic notebook, a computer, a personal digital assistant (PDA), or any other device, component, or object capable of initiating a data exchange facilitated by communication system 10. Mobile station 13 may also be inclusive of any suitable interface to the human user or to a computer, such as a display, microphone, keyboard, or other terminal equipment (such as for example an interface to a personal computer or to a facsimile machine in cases where mobile station 13 is used as a modem). Mobile station 13 may alternatively be any device or object that seeks to initiate a communication on behalf of another entity or element, such as a program, a database, or any other component, device, element, or object capable of initiating a voice or a data exchange within communication system 10. Data, as used herein in this document, refers to any type of numeric, voice, video, audio-visual, or script data, or any type of source or object code, or any other suitable information in any appropriate format that may be communicated from one point to another.

Base transceiver stations 16 are communicative interfaces that may comprise radio transmission/reception devices, components, or objects, and antennas. Base transceiver stations 16 may be coupled to any communications device or element, such as mobile station 13 for example. Base transceiver stations 16 may also be coupled to base station controllers 24 (via one or more intermediate elements) that use a landline (such as a T1/E1 line, for example) interface. Base transceiver stations 16 may operate as a series of complex radio modems where appropriate. Base transceiver stations 16 may also perform transcoding and rate adaptation functions in accordance with particular needs. Transcoding and rate adaptation may also be executed in a GSM environment in suitable hardware or software (for example in a transcoding and rate adaptation unit (TRAU)) positioned between mobile switching center 25 and base station controllers 24.

In operation, communication system 10 may include multiple cell sites 12 that communicate with mobile stations 13 using base transceiver stations 16 and cell site element 18. Central office site 14 may use aggregation node 22 and base station controllers 24 for communicating with cell site 12. One or more network management systems 20 may be coupled to either cell site 12 and central office site 14 (or both as desired), whereby mobile switching center 25 provides an interface between base station controllers 24 (of central office site 14) and PSTN 27, IP network 29, and/or any other suitable communication network. Base transceiver stations 16 may be coupled to cell site element 18 by a T1/E1 line or any other suitable communication link or element operable to facilitate data exchanges. A backhaul connection between cell site element 18 and aggregation node 22 may also include a T1/E1 line or any suitable communication link where appropriate and in accordance with particular needs.

Base station controllers 24 generally operate as management components for a radio interface. This may be done through remote commands to a corresponding base transceiver station within a mobile network. One base station controller 24 may manage more than one base transceiver stations 16. Some of the responsibilities of base station controllers 24 may include management of radio channels and assisting in handoff/handover scenarios.

In operation, layer one based (e.g. time division multiplexed (TDM), GSM, 8.60) or layer two based (e.g. Frame Relay, high level data link control (HDLC), asynchronous transfer mode (ATM), point to point protocol (PPP) over HDLC) traffic may be communicated by each base transceiver station 16 to cell site element 18 of cell site 12. Cell site element 18 may also receive IP or Ethernet traffic from network management system 20. Cell site element 18 may multiplex together payloads from the layer two based traffic that have a common destination. The multiplexed payloads, as well as any payloads extracted from the network management system IP or Ethernet traffic, may be communicated across a link to aggregation node 22 within central office site 14. Aggregation node 22 may demultiplex the payloads for delivery to an appropriate base station controller 24 or network management system 20.

Mobile switching center 25 operates as an interface between PSTN 27 and base station controllers 24, and potentially between multiple other mobile switching centers in a network and base station controller 24. Mobile switching center 25 represents a location that generally houses communication switches and computers and ensures that its cell sites in a given geographical area are properly connected. Cell sites refer generally to the transmission and reception equipment or components that connect elements such as mobile station 13 to a network, such as IP network 29 for example. By controlling transmission power and radio frequencies, mobile switching center 25 may monitor the movement and the transfer of a wireless communication from one cell to another cell and from one frequency or channel to another frequency or channel. In a given communication environment, communication system 10 may include multiple mobile switching centers 25 that are operable to facilitate communications between base station controller 24 and PSTN 27. Mobile switching center 25 may also generally handle connection, tracking, status, billing information, and other user information for communications in a designated area.

PSTN 27 represents a worldwide telephone system that is operable to conduct communications. PSTN 27 may be any land line telephone network operable to facilitate communications between two entities, such as two persons, a person and a computer, two computers, or in any other environment in which data is exchanged for purposes of communication. According to one embodiment of the present invention, PSTN 27 operates in a wireless domain, facilitating data exchanges between mobile station 13 and any other suitable entity within or external to communication system 10.

IP network 29 is a series of points or nodes of interconnected communication paths for receiving and transmitting packets of information that propagate through communication system 10. IP network 29 offers a communications interface between mobile stations 13 and any other suitable network equipment. IP network 29 may be any local area network (LAN), metropolitan area network (MAN), wide area network (WAN), wireless local area network (WLAN), virtual private network (VPN), or any other appropriate architectural system that facilitates communications in a network environment. IP network 29 implements a transmission control protocol/Internet protocol (TCP/IP) communication language protocol in a particular embodiment of the present invention. However, IP network 29 may alternatively implement any other suitable communications protocol for transmitting and receiving data packets within communication system 10.

In operation of an example implementation of FIG. 1, communication system 10 offers a codebook type mechanism for compression optimization. The incoming bit pattern may be evaluated to determine its corresponding match. A header (of suitable size) may then be used to indicate that the incoming stream is a pattern with a corresponding match. In cases where no match exists for the incoming stream, a header may be provided that reflects this condition. The header for the unmatched stream could effectively signal that a bit pattern is forthcoming and (inferentially) that the bit pattern could not be properly represented by a designated header bit. A demultiplexer (positioned downstream of the flow) may then simply perform reverse operations. For example, the demultiplexer may recognize the pattern and determine whether the stream has been matched. In cases where the stream was represented with a smaller component (i.e. the header), the header bits reveal the data that was within the stream. The data may then be restored and communicated to a subsequent destination. These operations achieve a simple and accurate procedure for compressing data, which is found to be commonly propagating in the network.

Figure 2:
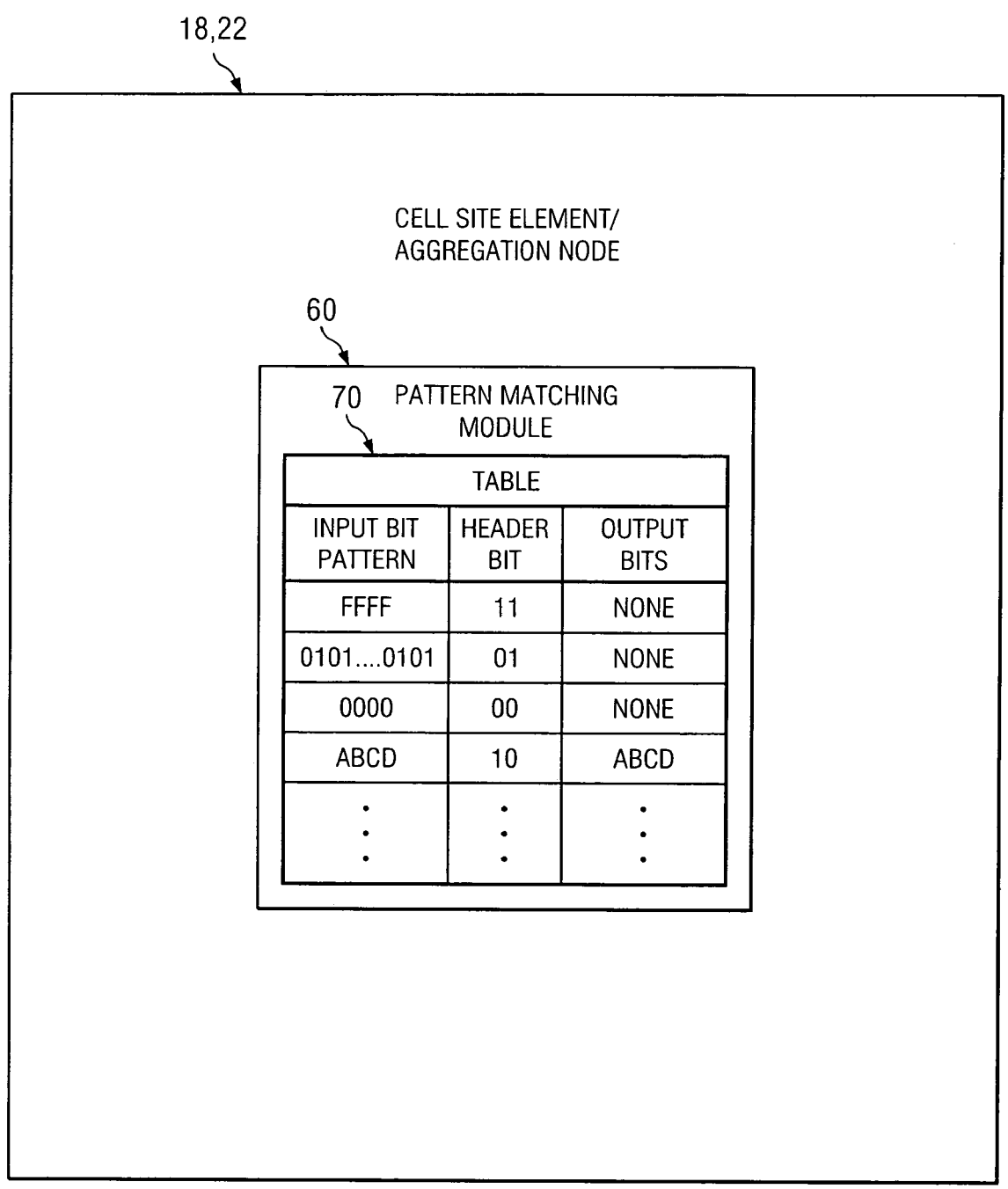
FIG. 2 is a block diagram of an example internal structure associated with either a cell site element or an aggregation node of the communication system.

FIG. 2 is a simplified block diagram of an example internal structure of either cell site element 18 or aggregation node 22 or both. Note that use of the terms 'aggregation node' and 'cell site element' herein in this document only connotes an example representation of one or more elements associated with base transceiver station 16 and base station controller 24. These terms have been offered for purposes of example and teaching only and do not necessarily imply any particular architecture or configuration. Moreover, the terms 'cell site element' and 'aggregation node' are intended to encompass any network element operable to facilitate a data exchange in a network environment. Accordingly, cell site element 18 and aggregation node 22 may be routers, switches, bridges, gateways, interfaces, or any other suitable module, device, component, element or object operable to effectuate one or more of the operations, tasks, or functionalities associated with compressing data as implied, described, or offered herein.

Each of these elements may include a compressor and/or a decompressor where appropriate. Additionally, each of these elements may include a pattern matching module 60, which includes a table 70. In an example embodiment, pattern matching module 60 reflects software included in cell site element 18 and/or aggregation node 22. This software may be used to effectuate the code-based compression for voice or packet data applications. Alternatively, such code-based compression and multiplexing may be achieved by any suitable hardware, component, device, application specific integrated circuit (ASIC), additional software, processor, algorithm, erasable programmable ROM (EPROM), electrically erasable programmable ROM (EEPROM), or any other suitable object that is operable to facilitate such operations. Considerable flexibility is provided by the structure of cell site element 18 and aggregation node 22 in the context of communication system 10. Thus, it can be easily appreciated that such a function could be provided external to cell site element 18 and aggregation node 22. In such cases, such a functionality could be readily embodied in a separate component, device, or module.

An example of one possible mapping is shown in table 70. Table 70 includes three columns reflecting a series of input bit patterns, a series of header bits, and a series of corresponding output bit patterns. Other patterns or combinations may be used for any particular need or purpose. For example, the 00 pattern can be used to indicate an alarm or any other frequently occurring communication pattern. The 00 pattern can also be extended to include a variable length header to indicate the presence of more than one other commonly occurring pattern and, thereby, improve efficiency at the cost of offering somewhat more complexity.

Assuming a total of M sub-rate DS0s needing to be compressed, the corresponding output would be a multiplexed packet with the following format: M*2 bits (payload header indication bits) 032 bits of stream i, 032 bits of stream j, 032 bits of stream k, ... 032 bits of stream p. In such an embodiment, the payload header would contain two bits per-flow in a fixed order of sub-rate DS0s. The corresponding payload is either not present (zero byte) or is a four byte chunk of a packet stream. The payloads may be placed in the same order as the payload header bits such that $0<=i<j<k<...<p<=M$. An appropriate transport header (such as user datagram protocol (UDP)/IP for example) may be applied to the above multiplexed packet and, subsequently, the active frame may be sent to the outbound interface. The attached header can also contain appropriate header bits to indicate T1/E1 line conditions and alarms. The outbound interface processing can compress the attached header before sending it to the outbound link.

A demultiplexer/decompressor may perform these tasks in reverse in order to undo what was done by the compressor and multiplexer. Stateless decompression may be achieved in that each stream does not require a state to be maintained for demultiplexing purposes. Decompression of a particular stream may depend only on the payload header bits. If the corresponding payload header bits are 10, then input bits may be copied as is to an output de-jitter buffer. If the corresponding payload header bits are other than 10, then the corresponding bit pattern is generated and copied to the output de-jitter buffer. The example output of the above procedure reflects sub-rate TDM streams of equal rate.

These TDM streams are TDM multiplexed to generate appropriate DS0s, which are further combined with drop-and-insert DS0s to create T1/E1s. Based on the header of the overall multiplexed packet, appropriate line conditions or alarms are generated at the output T1/E1 interface. Note that in order to increase robustness in the presence of errors, it is possible to protect payload header bits by a forward error correcting code and dropping the cyclic redundancy check (CRC) from point to point protocol (PPP) frames. An example of a simple error correcting method could be a table-based parity method, which can correct all one bit errors.

In operation of an example embodiment with reference to FIG. 2, three actual incoming bit patterns are reflected by the corresponding input bit patterns shown in table 70. These three patterns (FFFF, 0101 . . . , 0000) represent the most commonly occurring bit patterns that may be received at cell site element 18 in this particular network arrangement. The fourth input bit pattern is provided as ABCD. This input bit pattern does not have a matching pattern and, therefore, header bit '10' is used to reflect that this bit stream is not being compressed. Such a matching operation may effectively compress thirty-two bits into two bits. Elements that are downstream may receive the header bits and determine a match for the header bits such that the original bit pattern is generated. In the example of table 70, the two header bits must provide enough information such that the integrity of the original data stream is not compromised. For example, the first header bit example may correspond to all zeroes, the second to an alternating pattern of zero-one, and the third to all ones. The fourth header bit reflects any other occurrence of input bits. Thus, two bits cannot be used to reflect thirty-two bits (or any other suitable incoming bit number). In effect, the header bit signifies that two bits cannot possibly be used to express the complete stream and, therefore, the corresponding thirty-two bits are forthcoming.

It is critical to note that table 70 may be changed considerably, as table 70 offers only one example mapping for incoming bit patterns. Any number of other bit patterns may be readily accommodated by communication system 10 and are, therefore, included in the broad scope of its teachings. These pattern matches may be based on particular communication needs or on the prevalence of commonly reoccurring bit patterns in a given communications architecture. Additionally, the attached header bits may also provide E1/T1 line conditions and alarms. Also, additional bits may be added to the header bits (described in the example) in order to provide any number of functions, such as control parameters, the state of the given communication link, the condition of the E1/T1 line, the condition of an alarm, or the identification of a certain packet. Thus, these extra bits may provide any suitable additional information that may be relevant to a communication session occurring in communication system 10.

Figure 3:
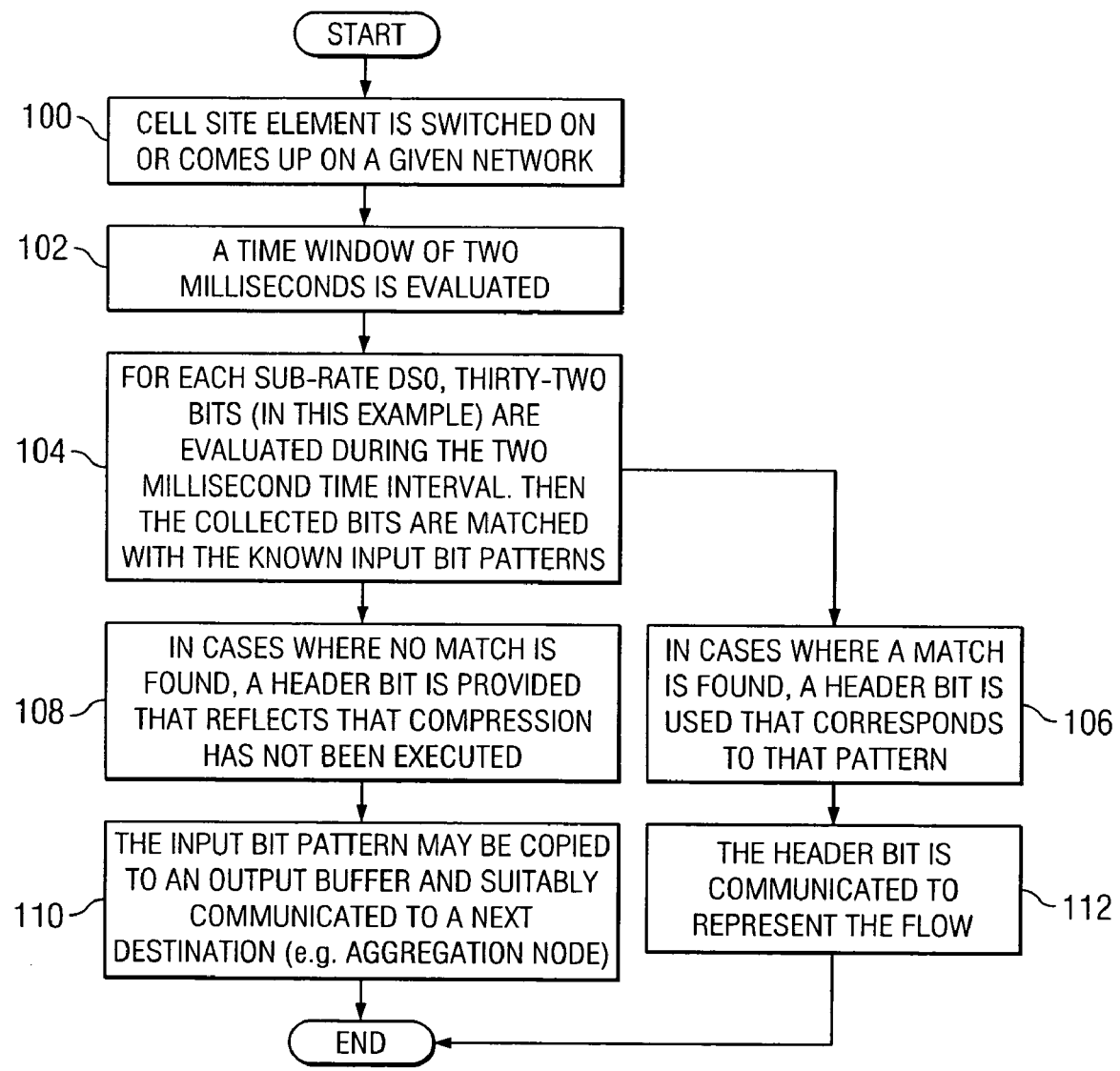
FIG. 3 is a simplified flowchart illustrating a series of example steps associated with the communication system.

FIG. 3 is a simplified flowchart illustrating a series of example steps associated with a method for compressing and multiplexing data in a communications environment. The method addresses one type of compression, but may be readily used with numerous other types where appropriate. The method may begin at step 100 where cell site element 18 is switched on or comes up on a given network. Note that communication system 10 executes a number of operations that are independent of activity. This is because IDLE bits are also addressed by communication system 10. Thus, at all times the functions of cell site element 18 may be achieved. Once cell site element 18 comes up, a time window of two milliseconds is evaluated at step 102.

For each sub-rate DS0, thirty-two bits (in this example) are evaluated during the two millisecond time interval. Then the collected bits are matched with the known input bit patterns at step 104. In cases where a match is found, a header bit is used that corresponds to that pattern at step 106. In cases where no match is found, an alternative header bit is provided that reflects that compression has not been executed for this pattern; this is illustrated by step 108. Thus, cell site element 18 may send a stream that includes a header bit indicating that the subsequent (uncompressed) communications flow will soon be delivered. Step 110 reflects this case where the flow is substantially unmodified and communicated to a next destination. In such an operation, the input bit pattern may be copied to an output buffer and suitably communicated to a next destination, as illustrated by step 110. Note that where no match exists, other compression protocols may be invoked to compress the data and then communicate it to its intended destination. Step 112 represents the scenario where a match was found and the header bit is communicated to a next destination. The header bit reveals or represents that underlying data flow that was received.

Each sub-rate DS0 may be evaluated in this fashion in order to generate a large packet for subsequent communication. The multiplexed packet may include an additional header bit that indicates the state of the E1/T1 line, the circuit ID, etc. Additionally at the compressor, on top of the multiplexed packet, an IP header may also be included (which may be further compressed). At a corresponding decompressor, the IP header may be decompressed and the header byte (indicating alarm conditions, state of the line, etc.) may be removed and passed on such that it may be later included in a transmission of an outgoing packet. The header bits may then be evaluated in order to generate (or replicate) data bits that correspond to the pattern that matches the header bits. These bits may then be passed on to a buffer and placed in a suitable format to be communicated at the output to a next destination.

Some of the steps illustrated in FIG. 3 may be changed or deleted where appropriate and additional steps may also be added to the flowchart. These changes may be based on specific communication system architectures or particular networking arrangements or configurations and do not depart from the scope or the teachings of the present invention.

Although the present invention has been described in detail with reference to particular embodiments illustrated in FIGS. 1 through 3, it should be understood that various other changes, substitutions, and alterations may be made hereto without departing from the spirit and scope of the present invention. For example, although the present invention has been described with reference to a number of elements included within communication system 10, these elements may be rearranged or positioned in order to accommodate any suitable routing and compression architectures. In addition, any of the described elements may be provided as separate external components to communication system 10 or to each other where appropriate. The present invention contemplates great flexibility in the arrangement of these elements as well as their internal components.

In addition, although the preceding description offers a compression protocol to be implemented with particular devices (e.g. aggregation node 22 and cell site element 18), the compression/suppression protocol provided may be embodied in a fabricated module that is designed specifically for effectuating the techniques discussed above. Moreover, such a module may be compatible with any appropriate protocol, other than those discussed herein, which were offered for purposes of teaching and example only.

Additionally, it should be recognized that table 70 has been offered for purposes of example and teaching only. Table 70 is somewhat simplistic, but could be added to or made more complex in order to achieve other pattern matching operations in accordance with the teachings of the present invention. Moreover, the two bit representation has been offered for purposes of brevity and clarity and could be readily replaced with a longer bit pattern to accommodate more sophisticated matching operations, to provide for more pattern matching possibilities, or to signal other information pertinent to such communications. Table 70 is malleable and offers considerable flexibility and, hence, should be recognized and construed as such.

Numerous other changes, substitutions, variations, alterations, and modifications may be ascertained to one skilled in the art and it is intended that the present invention encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any in any way that is not otherwise reflected in the appended claims.

What is claimed is:

1. An apparatus for communicating data, comprising a cell site element associated with a base transceiver station and operable to:
   perform the following for each Digital Signal 0 (DS0) channel of a plurality of DS0 channels to yield a plurality of header bit segments:
      receive a plurality of bits associated with a communications flow,
      determine if a match exists between the plurality of bits and a selected one of a plurality of bit patterns,
   if a match exists, select a header bit segment corresponding to the selected bit pattern that can be communicated in place of the plurality of bits; and
      if a match does not exist, select a header bit segment that indicates the plurality of bits is forthcoming; and
   generate a packet that comprises the plurality of header bit segments followed by any plurality of bits for which a match does not exist, the plurality of bits for which a match exists absent from the packet.

2. The apparatus of claim 1, wherein the header bit segment may be received and evaluated in order to restore the plurality of bits associated with the communications flow.

3. The apparatus of claim 1, wherein the cell site element is further operable to reference a table in order to determine if the match exists between the plurality of bits and the selected bit pattern.

4. The apparatus of claim 3, wherein the table includes a plurality of header bit segments that correspond to one or more communications flows that are common to an associated network.

5. The apparatus of claim 1, wherein the header bit segment is operable to provide information relating to a selected one of control parameters, a state of a corresponding communication link, a condition of the corresponding communication link, a condition of an alarm, and an identification of a certain packet.

6. The apparatus of claim 1, wherein the cell site element includes a compressor that is operable to compress one or more bits associated with the communications flow.

7. The apparatus of claim 1, wherein the cell site element includes a decompressor that is operable to decompress one or more bits associated with the communications flow.

8. The apparatus of claim 1, the plurality of bit patterns comprising at least one of the following:
   a sequence of zeros;
   a sequence of ones; and
   a sequence of alternating ones and zeros.

9. A method for communicating data, comprising:
   performing the following for each Digital Signal 0 (DS0) channel of a plurality of DS0 channels to yield a plurality of header bit segments:
      receiving a plurality of bits associated with a communications flow;
      determining if a match exists between the plurality of bits and a selected one of a plurality of bit patterns; and
      if a match exists, selecting a header bit segment corresponding to the selected bit pattern in place of the plurality of bits; and
      if a match does not exist, selecting a header bit segment that indicates the plurality of bits is forthcoming; and
   generating a packet that comprises the plurality of header bit segments followed by any plurality of bits for which a match does not exist, the plurality of bits for which a match exists absent from the packet.

10. The method of claim 9, further comprising:
   receiving the header bit segment; and
   evaluating the header bit segment in order to restore the plurality of bits associated with the communications flow.

11. The method of claim 9, further comprising:
   referencing a table in order to determine if the match exists between the plurality of bits and the header bit segment.

12. The method of claim 9, wherein the header bit segment is operable to provide information relating to a selected one of control parameters, a state of a corresponding communication link, a condition of the corresponding communication link, a condition of an alarm, and an identification of a certain packet.

13. The method of claim 9, further comprising:
compressing one or more bits associated with the communications flow.

14. The method of claim 9, further comprising:
decompressing one or more bits associated with the communications flow.

15. The method of claim 9, the plurality of bit patterns comprising at least one of the following:
a sequence of zeros;
a sequence of ones; and
a sequence of alternating ones and zeros.

16. A system for communicating data, comprising:
means for performing the following for each Digital Signal 0 (DS0) channel of a plurality of DS0 channels to yield a plurality of header bit segments:
receiving a plurality of bits associated with a communications flow;
determining if a match exists between the plurality of bits and a selected one of a plurality of bit patterns; and
if a match exists, selecting a header bit segment corresponding to the selected bit pattern in place of the plurality of bits; and
if a match does not exist, selecting a header bit segment that indicates the plurality of bits is forthcoming; and
means for generating a packet that comprises the plurality of header bit segments followed by any plurality of bits for which a match does not exist, the plurality of bits for which a match exists absent from the packet.

17. The system of claim 16, further comprising:
means for receiving the header bit segment; and
means for evaluating the header bit segment in order to restore the plurality of bits associated with the communications flow.

18. The system of claim 16, further comprising:
means for referencing a table in order to determine the match between the plurality of bits and the selected bit pattern.

19. The system of claim 16, wherein the header bit segment is operable to provide information relating to a selected one of control parameters, a state of a corresponding communication link, a condition of the corresponding communication link, a condition of an alarm, and an identification of a certain packet.

20. The system of claim 16, further comprising:
means for compressing one or more bits associated with the communications flow.

21. The system of claim 16, further comprising:
means for decompressing one or more bits associated with the communications flow.

22. The system of claim 16, the plurality of bit patterns comprising at least one of the following:
a sequence of zeros;
a sequence of ones; and
a sequence of alternating ones and zeros.

23. Software for communicating data, the software being embodied in a computer readable medium and comprising computer code such that when executed is operable to:
perform the following for each Digital Signal 0 (DS0) channel of a plurality of DS0 channels to yield a plurality of header bit segments:
receive a plurality of bits associated with a communications flow;
match the plurality of bits with a selected one of a plurality of bit patterns; and
if a match exists, select a header bit segment corresponding to the selected bit pattern in place of the plurality of bits; and
if a match does not exist, select a header bit segment that indicates the plurality of bits is forthcoming; and
generate a packet that comprises the plurality of header bit segments followed by any plurality of bits for which a match does not exist, the plurality of bits for which a match exists absent from the packet.

24. The medium of claim 23, wherein the code is further operable to:
receive the header bit segment; and
evaluate the header bit segment in order to restore the plurality of bits associated with the communications flow.

25. The medium of claim 23, wherein the code is further operable to:
reference a table in order to determine the match between the plurality of bits and the selected bit pattern.

26. The medium of claim 23, wherein the header bit segment is operable to provide information relating to a selected one of control parameters, a state of a corresponding communication link, a condition of the corresponding communication link, a condition of an alarm, and an identification of a certain packet.

27. The medium of claim 23, wherein the code is further operable to:
compress one or more bits associated with the communications flow.

28. The medium of claim 23, wherein the code is further operable to:
decompress one or more bits associated with the communications flow.

29. The medium of claim 23, the plurality of bit patterns comprising at least one of the following:
a sequence of zeros;
a sequence of ones; and
a sequence of alternating ones and zeros.

* * * * *